(12) United States Patent
Kang et al.

(10) Patent No.: US 7,878,564 B2
(45) Date of Patent: Feb. 1, 2011

(54) VACUUM TYPE PICKUP APPARATUS AND VACUUM TYPE PICKUP METHOD

(75) Inventors: Jin-won Kang, Cheonan-si (KR); Jun-young Lee, Yongin-si (KR); Jung-hyeon Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 507 days.

(21) Appl. No.: 11/987,482

(22) Filed: Nov. 30, 2007

(65) Prior Publication Data

US 2008/0129063 A1 Jun. 5, 2008

(30) Foreign Application Priority Data

Dec. 1, 2006 (KR) .................... 10-2006-0120945

(51) Int. Cl.
*B25J 15/06* (2006.01)

(52) U.S. Cl. ........................ 294/64.1; 901/40

(58) Field of Classification Search ............... 294/64.1, 294/64.2, 64.3, 65; 414/627, 737, 752.1; 901/40

See application file for complete search history.

(56) References Cited

U.S. PATENT DOCUMENTS

| | | | | |
|---|---|---|---|---|
| 3,698,755 A | * | 10/1972 | Sinclair | 294/65 |
| 4,252,497 A | * | 2/1981 | Burt | 414/627 |
| 4,650,233 A | * | 3/1987 | Mang et al. | 294/64.1 |
| 4,674,784 A | * | 6/1987 | Wooley | 294/64.1 |
| 5,183,670 A | * | 2/1993 | Trudeau | 425/126.1 |
| 5,385,441 A | * | 1/1995 | Swapp et al. | 414/627 |
| 5,456,510 A | * | 10/1995 | Coots et al. | 294/64.1 |
| 6,065,789 A | * | 5/2000 | Nagai et al. | 294/64.1 |
| 6,270,135 B1 | * | 8/2001 | Boyd et al. | 294/64.1 |

FOREIGN PATENT DOCUMENTS

| | | |
|---|---|---|
| JP | 08-078501 | 3/1996 |
| KR | 1997-0006416 | 6/1997 |
| KR | 2002-0053930 | 7/2002 |
| KR | 10-2002-0079651 | 10/2002 |

OTHER PUBLICATIONS

Office Action dated Sep. 18, 2007 for corresponding Korean Application No. 10-2006-120945.

* cited by examiner

*Primary Examiner*—Dean J Kramer
(74) *Attorney, Agent, or Firm*—Harness, Dickey & Pierce, PLC (57) ABSTRACT

A vacuum type pickup apparatus may include an absorption pad having an absorption inlet for contacting and/or picking up an object. A pad holder may be connected to the absorption pad. The pad holder may also have a vacuum line. A separator may be provided in the pad holder for forcibly releasing the object from the absorption inlet of the absorption pad. During the forcible release of the object, the air around the absorption pad may be drawn into the pad holder, thus reducing or preventing the potential contamination by impurities of the object as well as the equipment around the object. Also, an additional vacuum extinguisher may not be required, thus simplifying the structure of the vacuum type pickup apparatus and reducing installation costs. Furthermore, the object may be picked up and released in a relatively expedient, safe, and accurate manner, despite the suction force of the vacuum that may be maintained in the pad holder.

10 Claims, 11 Drawing Sheets

FIG. 14 ered and/or picking up an object. A pad holder having a vacuum line may be connected to the absorption pad. A separator may be provided in the pad holder for forcibly separating/releasing the object from the absorption inlet of the absorption pad.

VACUUM TYPE PICKUP APPARATUS AND VACUUM TYPE PICKUP METHOD

PRIORITY STATEMENT

This application claims priority under 35 U.S.C. §119 to Korean Patent Application No. 10-2006-0120945, filed on Dec. 1, 2006 in the Korean Intellectual Property Office (KIPO), the entire contents of which are incorporated herein by reference.

BACKGROUND

1. Technical Field

Example embodiments relate to a vacuum type pickup apparatus for picking up and moving an object (e.g., semiconductor chip/package) and a vacuum type pickup method.

2. Description of the Related Art

Figure 1:
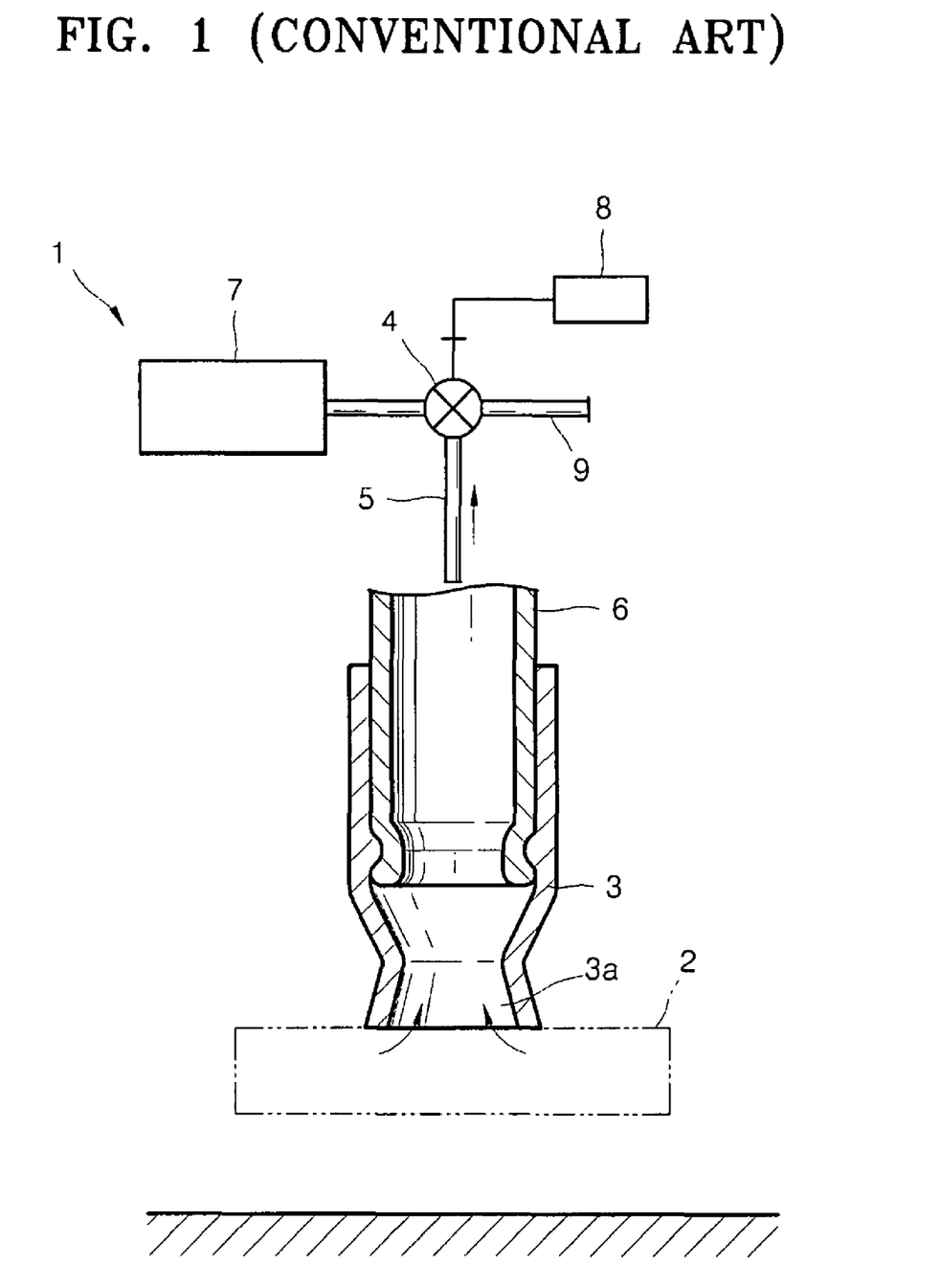
FIG. 1 is a cross-sectional view of a conventional vacuum type pickup apparatus picking up an object.

A vacuum type pickup apparatus may be used to pick up and move semiconductor packages by applying a suction force on the semiconductor packages. Referring to FIG. 1, a conventional vacuum type pickup apparatus 1 may include an absorption pad 3 having an absorption inlet 3a for contacting and picking up an object 2. The absorption pad 3 may be secured to a pad holder 6, and the pad holder 6 may be connected to a vacuum line 5, which, in turn, may be connected to a vacuum generator 7. A ventilation valve 4 may be provided on the vacuum line 5. The ventilation valve 4 may close the vacuum line 5 and open an external ventilation pipe 9 in response to a control signal from a valve controller 8 so as to change the pressure inside the pad holder 6 to atmospheric pressure.

Regarding the operation of the conventional vacuum type pickup apparatus 1, the vacuum generator 7 may generate a vacuum inside the pad holder 6. Additionally, the ventilation valve 4 may be in a vacuum absorption mode in response to a vacuum absorption signal from the valve controller 8. Consequently, the ventilation valve 4 may open the vacuum line 5 and block the external ventilation pipe 9 so as to generate a vacuum in the pad holder 6. Accordingly, the absorption inlet 3a of the absorption pad 3 may contact and pick up an object 2 by virtue of a suction force applied to the object 2.

Figure 2:
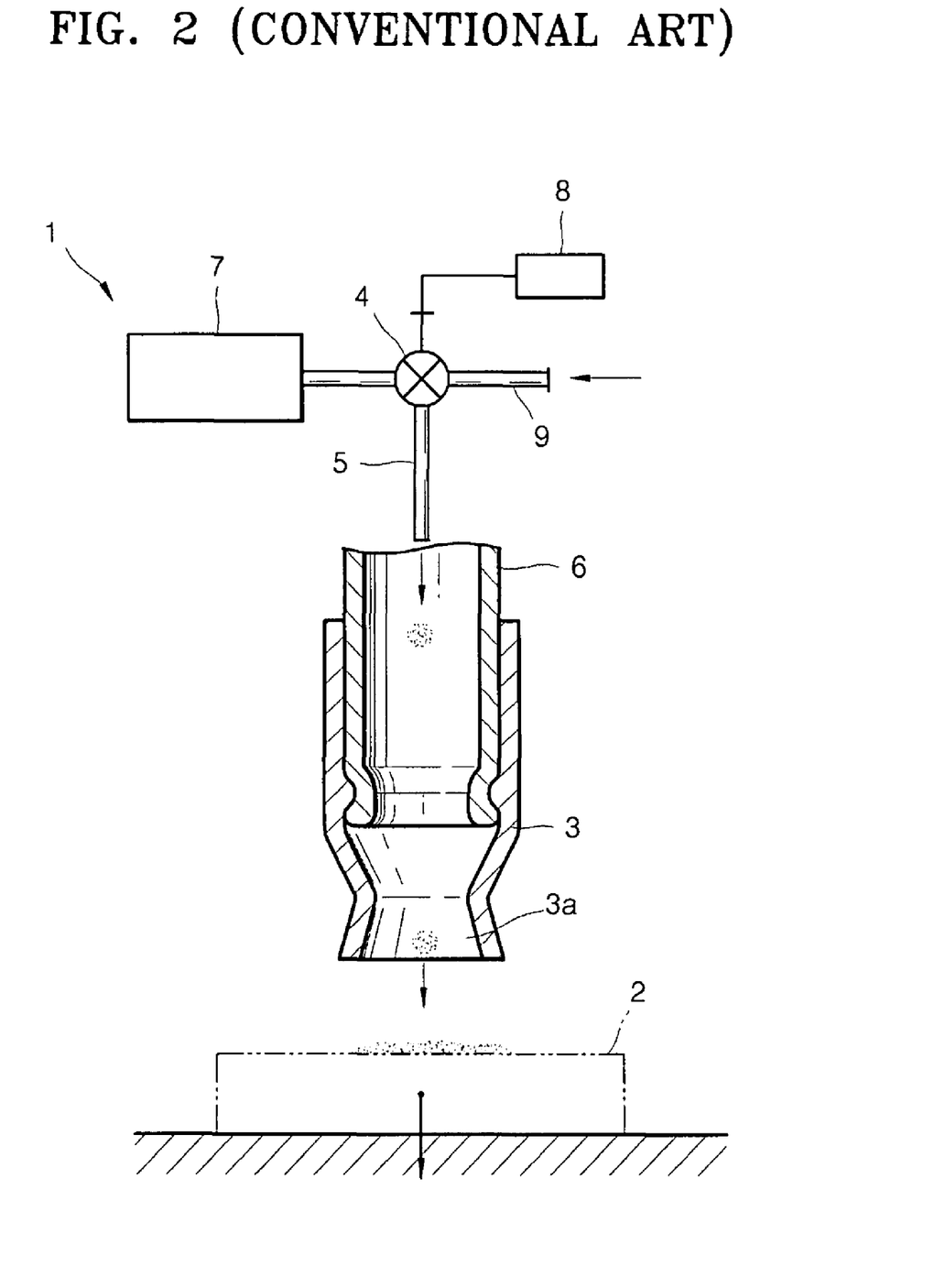
FIG. 2 is a cross-sectional view of the conventional vacuum type pickup apparatus of FIG. 1 releasing an object in a non-vacuum state.

The object 2 picked up by the conventional vacuum type pickup apparatus 1 may be relocated to a desired location and released. Referring to FIG. 2, the ventilation valve 4 may change a non-vacuum release mode in response to a non-vacuum release control signal from the value controller 8. Consequently, the ventilation valve 4 may block the vacuum line 5 and open the external ventilation pipe 9 so as to supply external air into the pad holder 6, thus, replacing the vacuum with atmospheric pressure. As a result of the atmospheric pressure in the pad holder 6, the suction force may be lost, and the object 2 may be released from the absorption inlet 3a of the absorption pad 3.

However, external impurities may contaminate the inside of the pad holder 6 and the object 2 by virtue of the external air introduced by the external ventilation pipe 9 during the non-vacuum release mode. Also, the conventional vacuum type pickup apparatus 1 may require the additional external ventilation pipe 9 for supplying external air to the pad holder 6, the ventilation valve 4, the valve controller 8, and various filters (not shown) for improving the quality of air supplied through the external ventilation pipe 9, thus structurally complicating the apparatus and increasing costs. Additionally, if the external air is supplied at a relatively high rate to the pad holder 6 through the external ventilation pipe 9, the object 2 picked up by the absorption pad 3 may be released relatively rapidly and may bounce to an undesired location. On the other hand, if the external air is supplied at a relatively low rate to the pad holder 6, the object 2 may be released relatively slowly, thus hindering the timing of the fabrication process. Furthermore, the vacuum generated in the pad holder 6 may be maintained, though relatively briefly, even after the vacuum line 5 is blocked, thus adding to the unpredictability of the release of the object 2.

SUMMARY OF EXAMPLE EMBODIMENTS

A vacuum type pickup apparatus according to example embodiments may include an absorption pad having an absorption inlet for contacting and/or picking up an object. A pad holder having a vacuum line may be connected to the absorption pad. A separator may be provided in the pad holder for forcibly separating/releasing the object from the absorption inlet of the absorption pad.

The separator may include a push bar provided in the pad holder. The push bar may be protracted so as to protrude out of the absorption inlet of the absorption pad and may be retracted so as to be received in the absorption pad. A push bar compression device may be provided in the pad holder and connected to the push bar so as to protract and/or retract the push bar. The push bar compression device may utilize the magnetic force of magnetic bodies, the recovery force of an elastic spring, and/or the weight of a weighted mover to facilitate the movement of the push bar.

The push bar compression device may include a first magnetic body provided in the pad holder. A second magnetic body may be adjacent to the first magnetic body and may be provided so as to permit movement along an inner guide surface of the pad holder. The adjacent surfaces of the first and second magnetic bodies may have the same polarity so as to generate a repulsive force between the first and second magnetic bodies. The first and second magnetic bodies may be disc-shaped, and one or more through holes may be formed in each of the first and second magnetic bodies so that an object may be subject to the vacuum facilitating the pickup of the object. The first and/or second magnetic bodies may be permanent magnets.

The separator may also include a piston provided in the pad holder. The piston may have a protruding end extending to the absorption pad. The piston may be protracted so as to protrude out of the absorption inlet of the absorption pad and may be retracted so as to be received in the absorption pad. A cylinder may be provided in the pad holder and connected to the piston so as to protract and/or retract the piston. A hydraulic controller may supply a hydraulic control signal to the cylinder.

The separator may also include a moving board provided in the pad holder. The moving board may have a protruding end extending to the absorption pad. The moving board may be protracted so as to protrude out of the absorption inlet of the absorption pad and may be retracted so as to be received in the absorption pad. A rack gear and a corresponding pinion gear may be provided in the pad holder and connected to the moving board so as to protract and/or retract the moving board. A motor may be provided to drive the pinion gear. A controller may supply a control signal to the motor.

The separator may also include a screw rod provided in the pad holder and connected to the moving board so as to protract and/or retract the moving board. The screw rod may penetrate the moving board, and a motor may be provided to drive the screw rod. A controller may supply a control signal to the motor.

A vacuum type pickup method according to example embodiments may include generating a vacuum in a pad holder, wherein the pad holder may be connected to an absorption pad. An absorption inlet of the absorption pad may contact an object so as to pick up an object. The object may be forcibly separated/released from the absorption inlet of the absorption pad by using a separator provided in the pad holder. The separator may include a push bar which protrudes out of the absorption inlet of the absorption pad, wherein the push bar is protracted and/or retracted using the magnetic force of the magnetic bodies (e.g., permanent magnets and/or electromagnets) that may be provided in the pad holder.

DETAILED DESCRIPTION OF EXAMPLE EMBODIMENTS

It will be understood that when an element or layer is referred to as being "on", "connected to", "coupled to", or "covering" another element or layer, it may be directly on, connected to, coupled to, or covering the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, e.g., "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Figure 3:
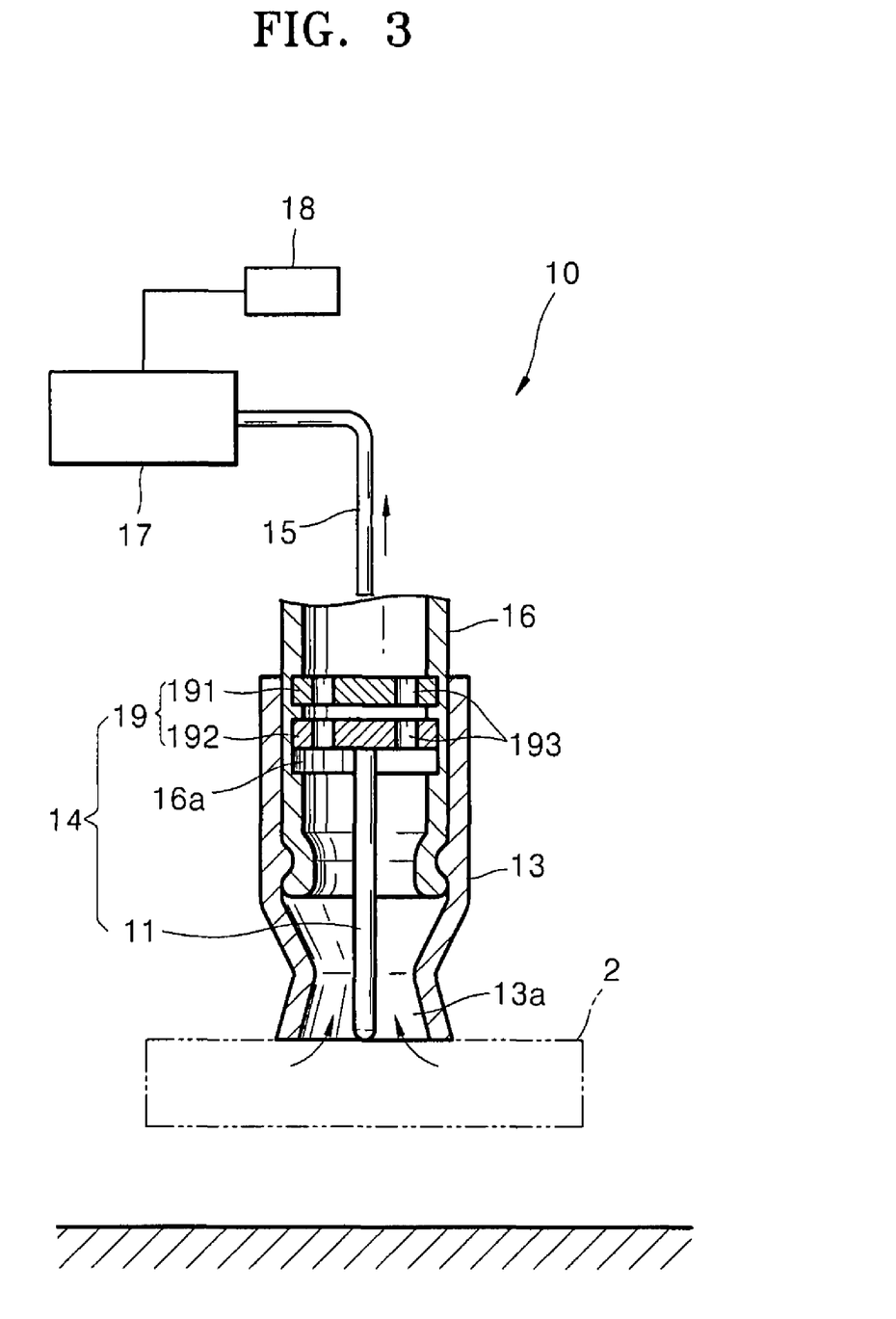
FIG. 3 is a cross-sectional view of a vacuum type pickup apparatus according to example embodiments picking up an object.
Figure 4:
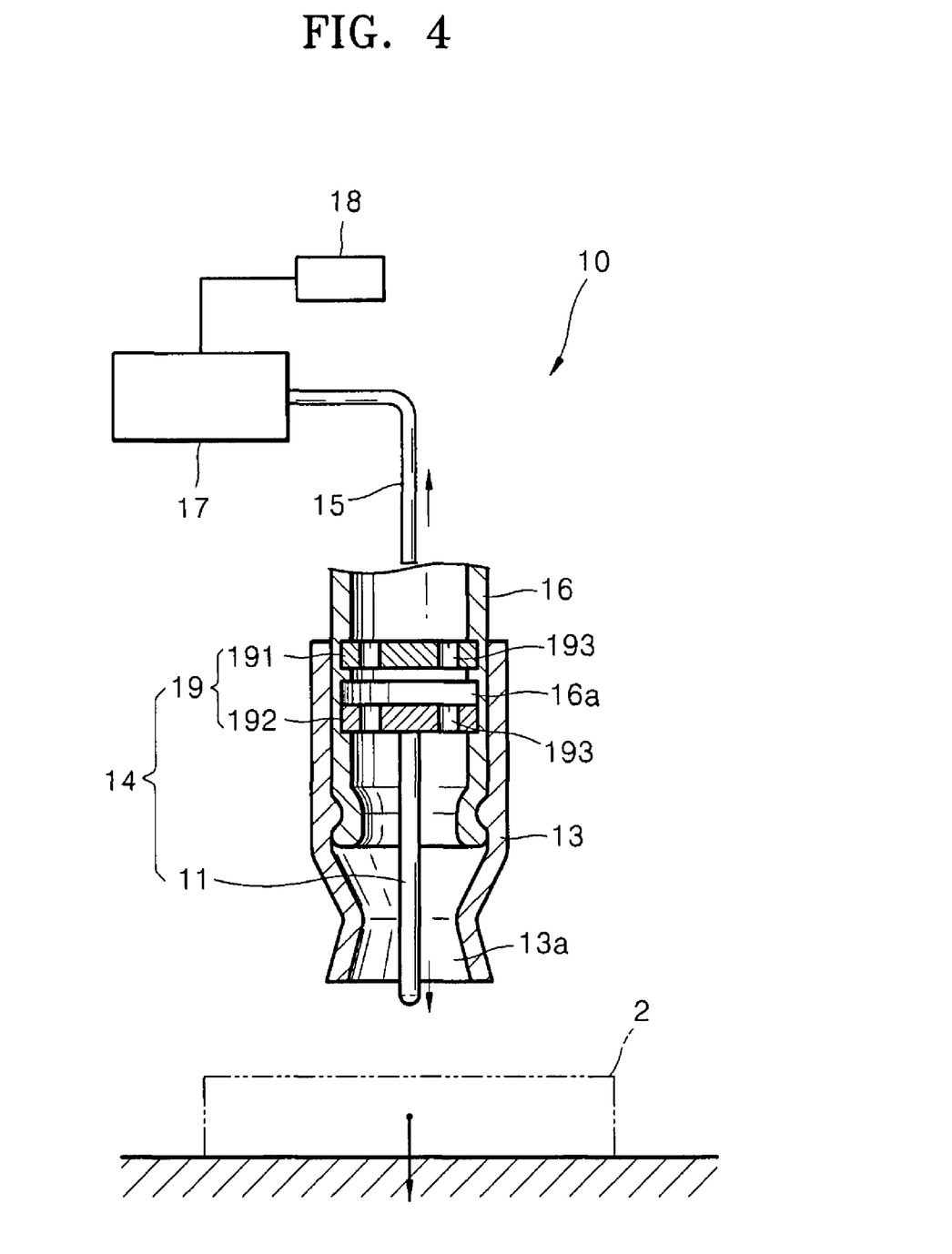
FIG. 4 is a cross-sectional view of the vacuum type pickup apparatus of FIG. 3 forcibly releasing the object while in a vacuum state.

Referring to FIGS. 3 and 4, a vacuum type pickup apparatus 10 according to example embodiments may pick up, move, and/or release an object 2 (e.g., semiconductor chip and/or semiconductor package). The vacuum type pickup apparatus 10 may include an absorption pad 13, a pad holder 16, and/or a separator 14.

The absorption pad 13 may have an absorption inlet 13a for contacting the object 2. The absorption inlet 13a may be formed of a soft elastic rubber, silicon, or a synthetic resin so as to increase the contact area with the object 2. The absorption pad 13 may be connected to a pad holder 16. The pad holder 16 may include a vacuum line 15, which may be connected to a vacuum generator 17 that is controlled by a vacuum controller 18.

The separator 14 may be provided in the pad holder 16 to forcibly separate/release the object 2 that is absorbed/picked up by the absorption inlet 13a of the absorption pad 13. The separator 14 may include a push bar 11 and a push bar compression device 19. The push bar 11 may be provided in the pad holder 16. A front end of the push bar 11 may contact the object 2, and the push bar 11 may move outward (protract) so as to protrude from the absorption inlet 13a of the absorption pad 13. The push bar 11 may also move inward (retract) so as to be received in the absorption pad 13. The front end of the push bar 11 may be rounded and/or formed of an elastic rubber, silicon, or synthetic resin to protect the object 2 when making contact.

The push bar compression device 19 may be provided between the pad holder 16 and the push bar 11 so as to protract and/or retract the push bar 11. The push bar compression device 19 may utilize of the magnetic force (e.g., attractive and/or repulsive forces) of magnetic bodies provided in the pad holder 16 to facilitate the movement of the push bar 11. Referring to FIGS. 3-6, the push bar compression device 19 may include a first magnetic body 191 and a second magnetic body 192. The first magnetic body 191 may be mounted in the pad holder 16. A position adjusting device (not shown) may be optionally provided so that the position of the first magnetic body 191 may be adjusted and secured (e.g., screw).

Figure 5:
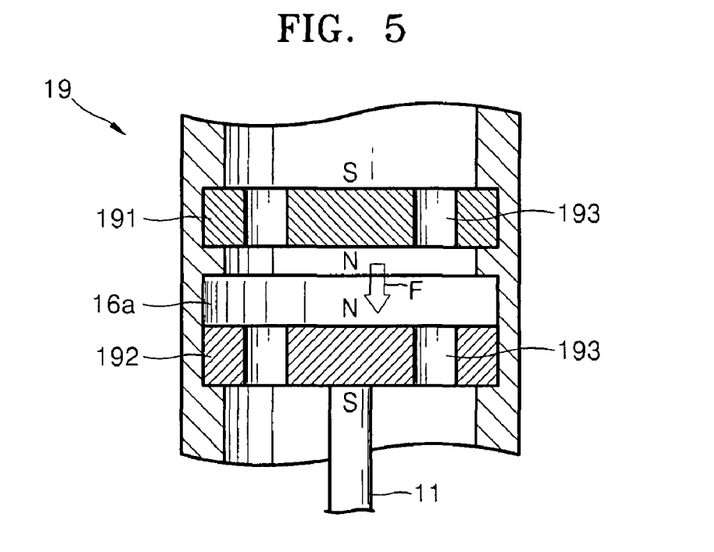
FIG. 5 is an enlarged cross-sectional view of a push bar compression device according to example embodiments.
Figure 6:
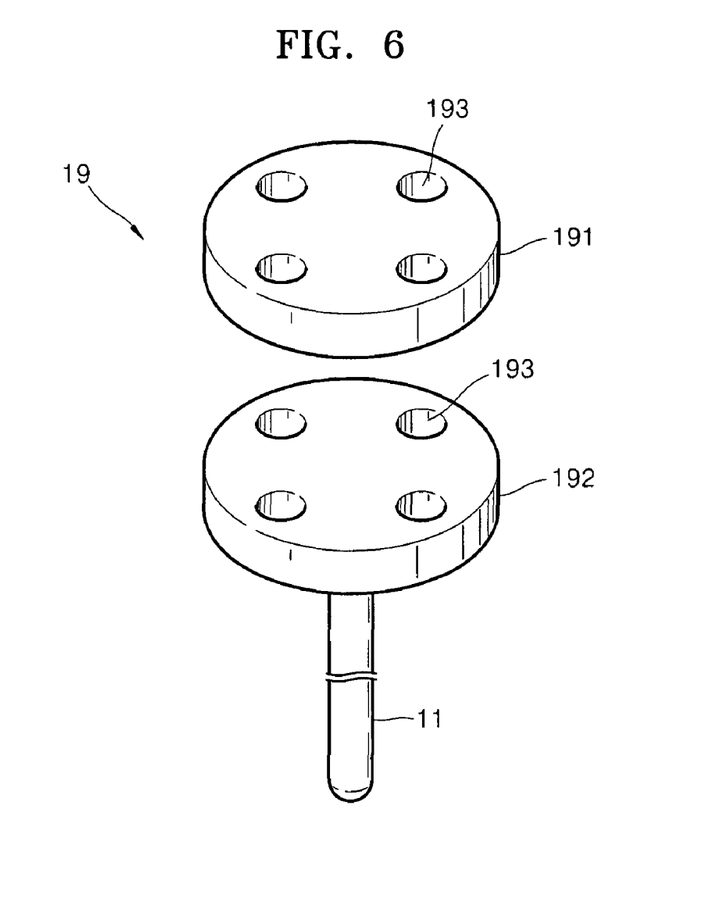
FIG. 6 is an exploded perspective view of the first and second magnetic bodies of the push bar compression device of FIG. 5.

The second magnetic body 192 may be provided so as to be able to move along an inner guide surface 16a of the pad holder 16. Referring to FIG. 5, the second magnetic body 192 may be provided so that adjacent surfaces of the first and second magnetic bodies 191 and 192 have the same polarity, thus resulting in a repulsive force (F) between the first and second magnetic bodies 191 and 192. The push bar 11 may be secured on the surface of the second magnetic body 192 not facing the first magnetic body 191. Referring to FIG. 6, the first and second magnetic bodies 191 and 192 may be disc-shaped and may include one or more (e.g., four) through holes 193 so as to not obstruct the suction force of the vacuum exerted on the object 2. The first and second magnetic bodies 191 and 192 may be permanent magnets.

When an object 2 is to be picked up, the vacuum generator 17 may operate in response to a turn-on (ON) signal from the vacuum controller 18, and a vacuum may be generated in the pad holder 16. Consequently, the absorption inlet 13a of the absorption pad 13 may contact and pick up the object 2 because of the suction force exerted on the object 2 as a result of the vacuum. When the suction force remains greater than the repulsive force F exerted on the object 2 by the first and second magnetic bodies 191 and 192, the object 2 may continue to be held by the absorption inlet 13a of the absorption pad 13. Accordingly, the object 2 may be moved to a desired location.

When the object 2 is to be released, the operation of the vacuum generator 17 may decrease in response to a turn-down (DOWN) signal (or stop in response to a turn-off (OFF) signal) from the vacuum controller 18, and the vacuum in the pad holder 16 may weaken to a lower level. Consequently, weakened vacuum may decrease the suction force holding the object 2 onto the absorption inlet 13a of the absorption pad 13. When the suction force becomes less than the repulsive force F exerted on the object 2 by the first and second magnetic bodies 191 and 192, the push bar 11 protrudes out of the absorption inlet 13a of the absorption pad 13 and forcibly releases the object 2. During the forcible release of the object 2, external air may be drawn into the absorption inlet 13a of the absorption pad 13 as a result of the vacuum (lower level). Accordingly, impurities may be drawn into the absorption inlet 13a of the absorption pad 13, thus reducing or preventing the contamination of the object 2.

Therefore, the vacuum type pickup apparatus 10 may not require additional devices, e.g., an external ventilation pipe, a ventilation valve, and a valve controller, thus simplifying the structure of the vacuum type pickup apparatus 10 and reducing the fabrication costs. Additionally, the speed and accuracy of the pickup and release of the object 2 may be adjusted relatively easily based on the forces generated by the first and second magnetic bodies 191 and 192 as a result of their magnetism and respective positions.

Figure 7:
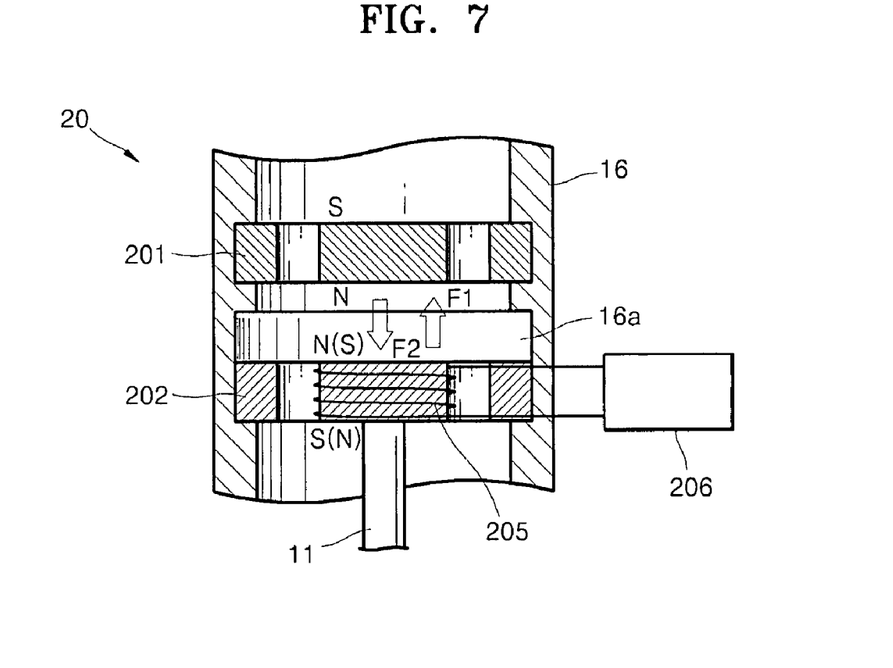
FIG. 7 is an enlarged cross-sectional view of another push bar compression device according to example embodiments.

Referring to FIG. 7, in a vacuum type pickup apparatus 20 according to example embodiments, a first magnetic body 201 may be a permanent magnet, and second magnetic body 202 may be an electromagnet. A coil 205 may be provided on the second magnetic body 202 to allow the surface of the second magnetic body 202 facing the first magnetic body 201 to change its polarity. A controller 206 that is connected to the coil 205 may supply an electric current to the second magnetic body 202 so as to change its polarity. Thus, an attractive force (F1) and a repulsive force (F2) may be selectively generated between the first and second magnetic bodies 201 and 202. For example, the controller 206 may supply an attractive force control signal to the coil 205 so as to generate an attractive force F1 between the first magnetic body 201 and the second magnetic body 202 when an object 2 is being picked up. On the other hand, the controller 206 may apply a repulsive force control signal to the coil 205 so as to generate a repulsive force F2 between the first magnetic body 201 and the second magnetic body 202 when the object 2 is being released.

When an object 2 is being picked up, the controller 206 may supply an attractive force control signal that makes the polarity of the surface of the second magnetic body 202 (electromagnet) facing the first magnetic body 201 a S pole so that an attractive force F1 may be generated between the first and second magnetic bodies 201 and 202. Consequently, the push bar 11 may retract into the absorption pad 13 because of the attractive force F1. Accordingly, the object 2 may be picked up by the suction force of the absorption pad 13.

The object 2 that is picked up may be moved to a desired location and forcibly released. The controller 206 may supply a repulsive force control signal that makes the polarity of the surface of the second magnetic body 202 (electromagnet) facing the first magnetic body 201 a N pole so that a repulsive force F2 may be generated between the first and second magnetic bodies 201 and 202. Consequently, the push bar 11 may protract out of the absorption inlet 13a of the absorption pad 13 as a result of the repulsive force F2 so as to forcibly release the object 2.

Figure 8:
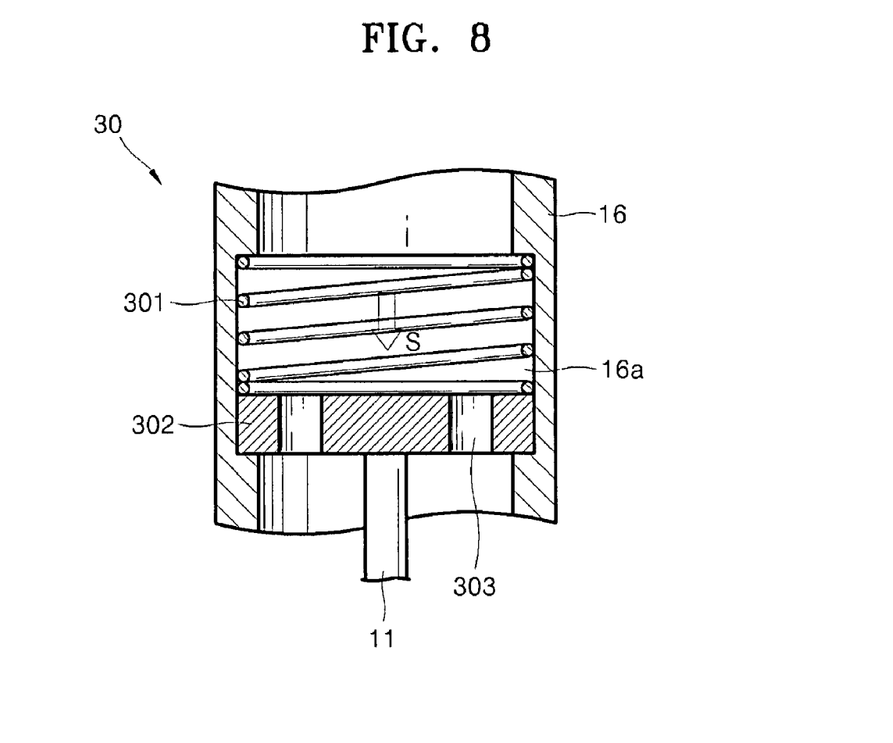
FIG. 8 is an enlarged cross-sectional view of another push bar compression device according to example embodiments.

Referring to FIG. 8, a vacuum type pickup apparatus 30 according to example embodiments may use the recovery force S of an elastic spring 301 provided between the pad holder 16 and the push bar 11 as a push bar compression device that moves the push bar 11. The push bar compression device may include a mover 302 and the elastic spring 301. The elastic spring 301 may be provided between the mover 302 and the pad holder 16 so that the recovery force S may be exerted on the mover 302. The mover 302 may be provided to move along the inner guide surface 16a of the pad holder 16, and the push bar 11 may be provided on the mover 302. One or more through holes 303 may be formed in the mover 302 so as to allow the suction force of the vacuum to be exerted on the object 2.

When the object 2 is to be picked up, a vacuum may be generated in the pad holder 16 so that a suction force may be exerted on the object 2 by the absorption inlet 13a of the absorption pad 13. The suction force of the vacuum may be greater than the recovery force S exerted on the object 2 by the elastic spring 301 so that the push bar 11 may retract into the absorption pad 13, and the object 2 may be picked up.

The object 2 may be moved to a desired position and forcibly released. When the vacuum in the pad holder 16 is decreased, the suction force may become less than the recovery force S of the elastic spring 301. Consequently, the recovery force S of the elastic spring 301 may cause the push bar 11 to protrude from the absorption inlet 13a of the absorption pad 13 so as to forcibly release the object 2.

Figure 9:
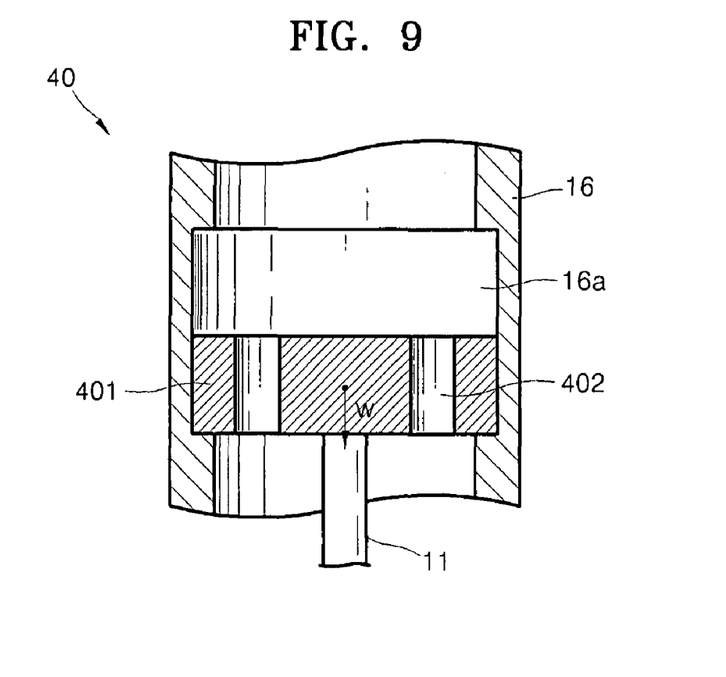
FIG. 9 is an enlarged cross-sectional view of another push bar compression device according to example embodiments.

Referring to FIG. 9, a vacuum type pickup apparatus 40 according to example embodiments may use the weight (W) of a weighted body that is provided between the push bar 11 and the pad holder 16 as a push bar compression device. The push bar compression device may include a weighted mover 401 that is provided to move along the inner guide surface 16a of the pad holder 16. The push bar 11 may be provided on the weighted mover 401, and the weighted mover 401 may have a weight W that is exerted on the push bar 11. One or more through holes 402 may be formed in the weighted mover 401 so as to allow the suction force of the vacuum to be exerted on the object 2 during pickup.

When a vacuum is generated in the pad holder 16, a suction force may be exerted on the object 2 by the absorption inlet 13a of the absorption pad 13. The suction force of the vacuum may be greater than the gravitational force on the weighted mover 401 so as to overcome the weight W of the weighted mover 401. Consequently, the push bar 11 may retract into the absorption pad 13 to allow the object 2 to be picked up.

The object 2 that is picked up may be moved to a desired location and forcibly released. When the vacuum in the pad holder 16 is decreased, the suction force may become less than the gravitation force on the weighted mover 401, such that the weight W of the weighted mover 401 may overcome the suction force of the vacuum. Consequently, the weight W of the weighted mover 401 may cause the push bar 11 to protrude from the absorption inlet 13a of the absorption pad 13 so as to forcibly release the object 2.

Figure 10:
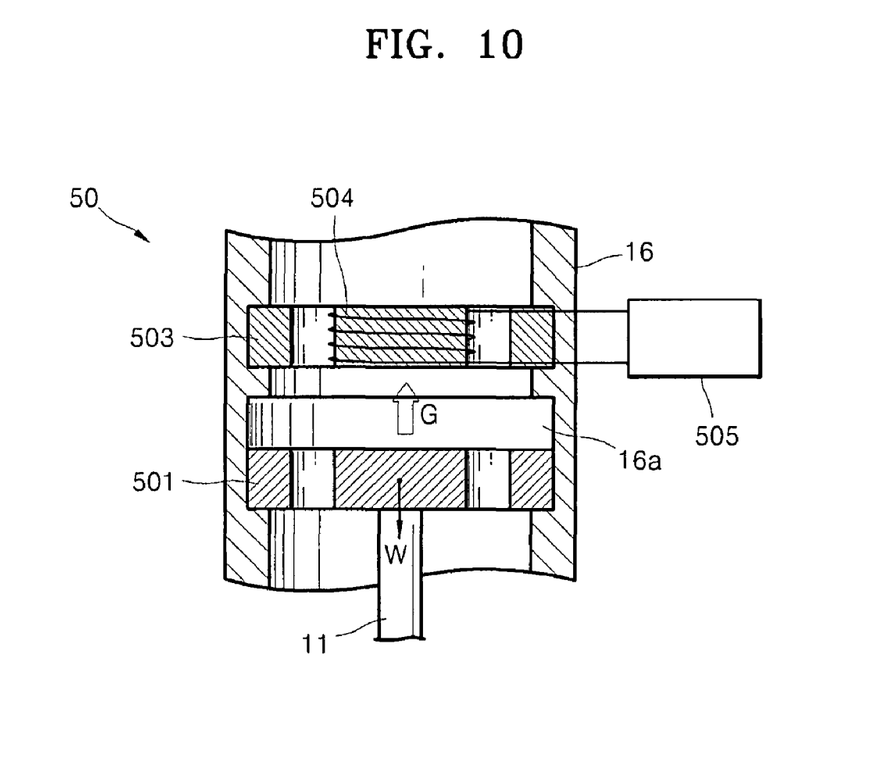
FIG. 10 is an enlarged cross-sectional view of another push bar compression device according to example embodiments.

Referring to FIG. 10, a vacuum type pickup apparatus 50 according to example embodiments may include a weighted mover 501 formed of a magnetic body and an electromagnet 503 provided between the pad holder 16 and the weighted mover 501. A controller 505 may supply an electric current to a coil 504 on the electromagnet 503 so as to generate a magnetic force G on the weighted mover 501. For example, the controller 505 may supply a magnetic force generation signal to the coil 504 so that the magnetic force G may be generated between the weighted mover 501 and the electromagnet 503 when the object 2 is to be picked up. On the other hand, the controller 505 may supply a magnetic force suspension signal to the coil 504 so that the magnetic force G is not generated between the electromagnet 503 and the weighted mover 501 when the object 2 is to be released.

To pick up the object 2, a vacuum may be generated in the pad holder 16 so that a suction force may be exerted on the object 2 by the absorption inlet 13a of the absorption pad 13. The push bar 11 may also be retracted into the absorption pad 13 by the magnetic force G of the electromagnet 503 that is exerted on the weighted mover 501. The magnetic force G may be generated in response to a magnetic force generation signal from the controller 505. Accordingly, the object 2 may be picked up.

The object 2 that is picked up may be moved to a desired location and forcibly released. The vacuum in the pad holder 16 may be decreased so as to reduce the suction force on the object 2, and the electromagnet 503 may stop generating the magnetic force G in response to the magnetic force suspension signal from the controller 505. Consequently, the weight W of the weighted mover 501 may overcome the reduced suction force such that the push bar 11 may protrude out of the absorption inlet 13a of the absorption pad 13 so as to forcibly release the object 2.

Figure 11:
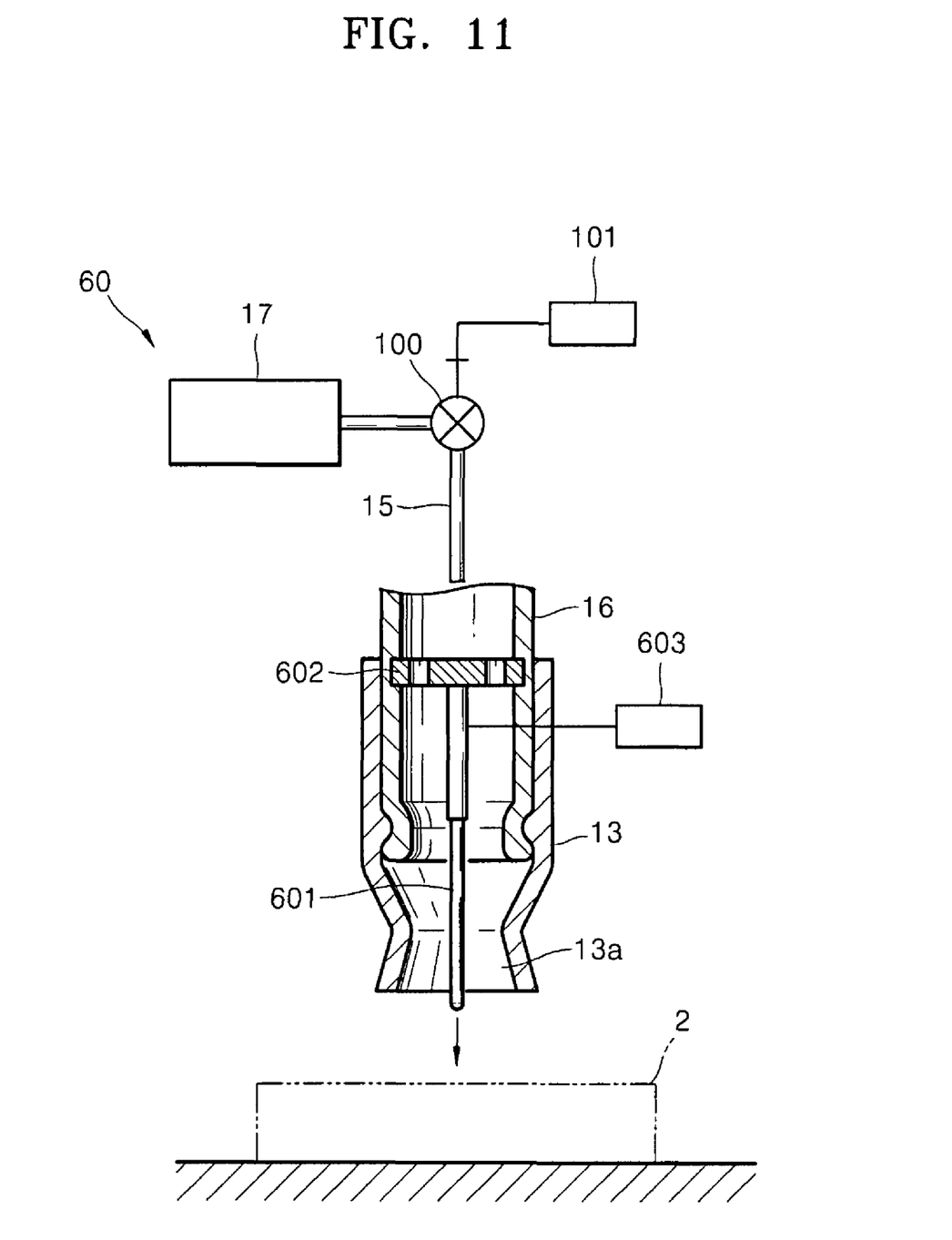
FIG. 11 is a cross-sectional view of a separator according to example embodiments.

Referring to FIG. 11, a vacuum type pickup apparatus 60 according to example embodiments may have a separator including a piston 601, a cylinder 602, and a hydraulic controller 603. The piston 601 may be provided in the pad holder 16 such that a front end of the piston 601 may contact an object 2. The piston 601 may be protracted so as to protrude out of the absorption inlet 13a of the absorption pad 13 and may be retracted so as to be received in the absorption pad 13. The cylinder 602 may be provided between the pad holder 16 and the piston 601 to facilitate the movement of the piston 601. The hydraulic controller 603 may supply a contraction control signal or an extension control signal to the cylinder 602.

To pick up an object 2, a vacuum may be generated in the pad holder 16 so that a suction force may be exerted on the object 2 by the absorption inlet 13a of the absorption pad 13. The piston 601 may be retracted into the absorption pad 13 by the cylinder 602 in response to a contraction control signal from the hydraulic controller 603. Accordingly, the object 2 may be picked up.

The object 2 that is picked up may be moved to a desired location and forcibly released. When the vacuum in the pad holder 16 is decreased, the suction force exerted on the object 2 may be reduced so as to be less than the hydraulic force that may be applied to the piston 601 by the cylinder 602. Consequently, the piston 601 may be protracted by the cylinder 602 in response to an extension control signal from the hydraulic controller 603 such that the piston 601 protrudes out of the absorption inlet 13a of the absorption pad 13 so as to forcibly release the object 2. Alternatively, the vacuum may be maintained and the hydraulic force may be increased to forcibly release the object 2.

Figure 12:
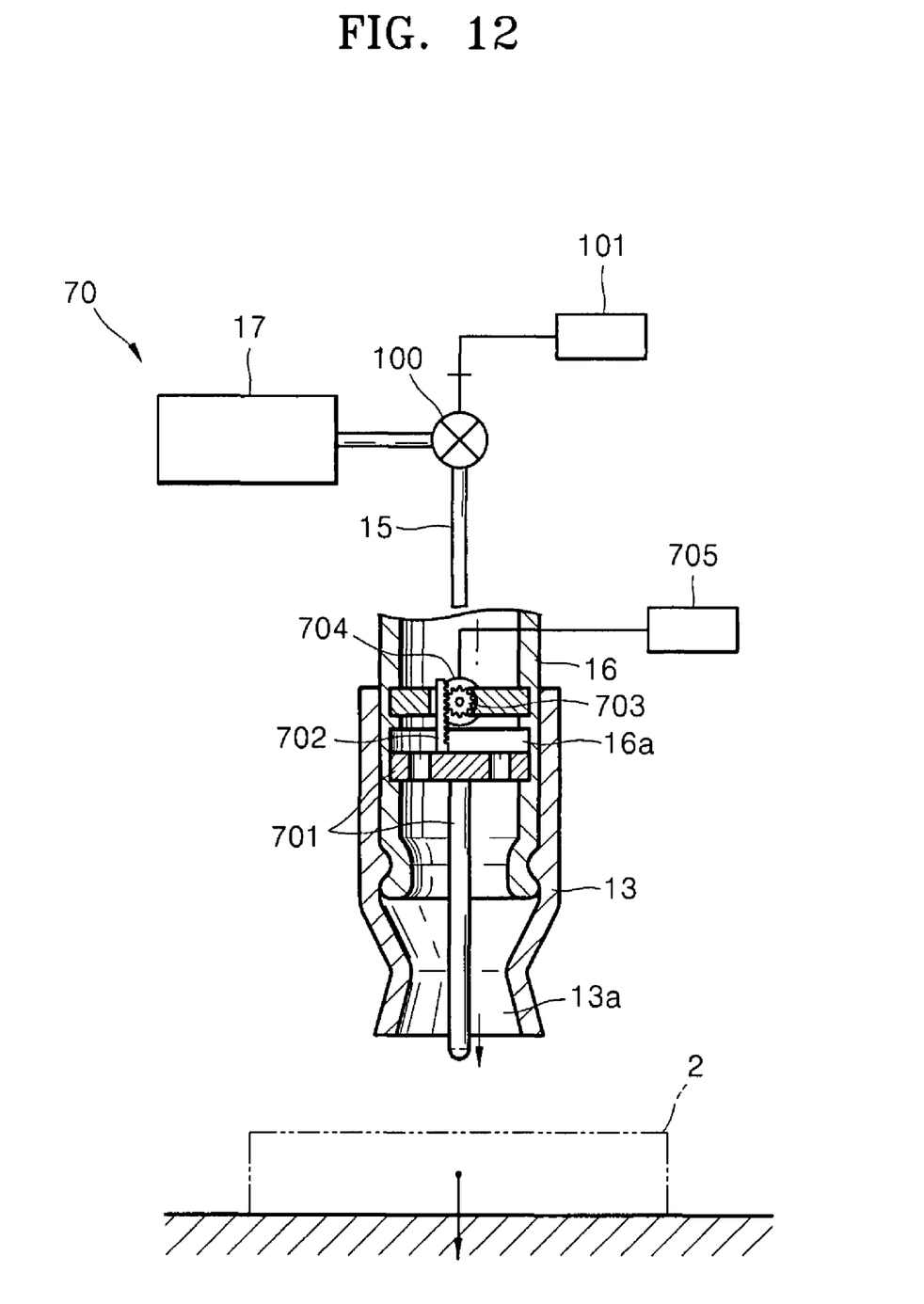
FIG. 12 is a cross-sectional view of another separator according to example embodiments.

Referring to FIG. 12, a vacuum type pickup apparatus 70 according to example embodiments may have a separator including a moving board 701, a rack gear 702 and a corresponding pinion gear 703, a motor 704, and a controller 705. The moving board 701 may be provided in the pad holder 16 so that a front end of the moving board 701 may contact an object 2. The moving board 701 may be protracted so as to protrude out of the absorption inlet 13a of the absorption pad 13 and retracted so as to be received in the absorption pad 13. The rack gear 702 and pinion gear 703 may be provided between the pad holder 16 and the moving board 701. The rack gear 702 may be provided on the moving board 701, and the pinion gear 703 may be provided on the pad holder 16. The motor 704 may drive the pinion gear 703. The controller 705 may supply a rotation signal and a counter-rotation signal to the motor 704.

When a vacuum is generated in the pad holder 16, a suction force may be exerted on the object 2 by the absorption inlet 13a of the absorption pad 13. The motor 705 may cause the pinion gear 703 to rotate in response to the rotation signal from the controller 705, so that the moving board 701 may be retracted into the absorption pad 13. Accordingly, the object 2 may be picked up.

The object 2 that is picked up may be moved to a desired location and forcibly released. When the vacuum in the pad holder 16 is decreased, the suction force exerted on the object 2 may be reduced so as to be less than the force that may be applied by the motor 704 onto the moving board 701 via the rack gear 702 and pinion gear 703. Consequently, the motor 704 may cause the pinion gear 703 to rotate in response to a counter-rotation signal from the controller 705 such that the moving board 701 is protracted so as to protrude out of the absorption inlet 13a of the absorption pad 13 to forcibly release the object 2. Alternatively, the vacuum may be maintained and the force applied by the motor 704 may be increased to forcibly release the object 2.

Figure 13:
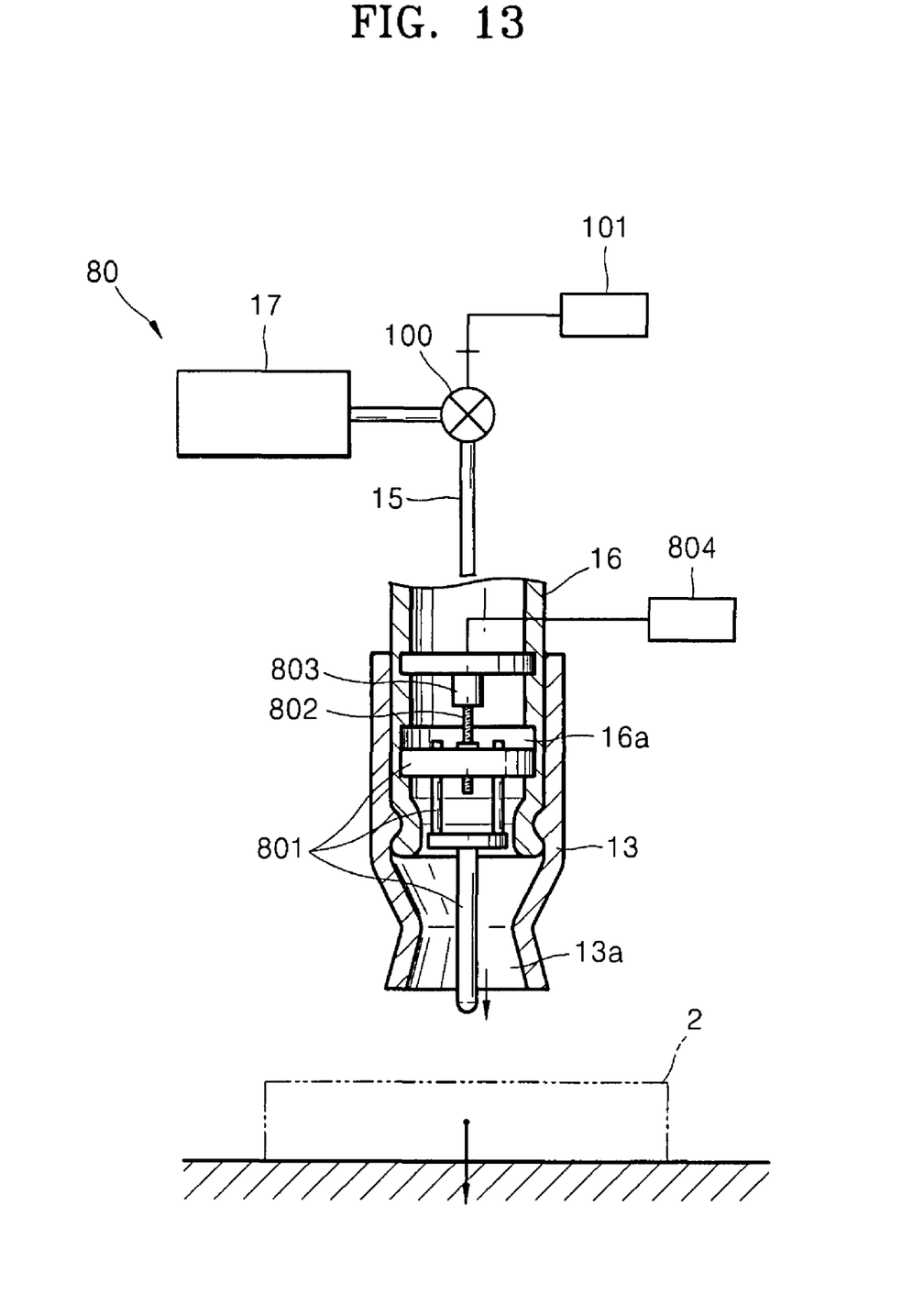
FIG. 13 is a cross-sectional view of another separator according to example embodiments.

Referring to FIG. 13, a vacuum type pickup apparatus 80 according to example embodiments may have a separator including a moving board 801, a screw rod 802, a motor 803, and a controller 804. The moving board 801 may be provided in the pad holder 16 such that a front end of the moving board 801 may contact the object 2. The moving board 801 may be protracted so as to protrude out of the absorption inlet 13a of the absorption pad 13 and retracted so as to be received in the absorption pad 13. The screw rod 802 may be provided between the pad holder 16 and the moving board 801. The screw rod 802 may also penetrate through the moving board 801. The motor 803 may rotate the screw rod 802 to move the moving board 801. The controller 804 may supply a rotation signal and a counter-rotation signal to the motor 803.

When a vacuum is generated in the pad holder 16, a suction force may be exerted on the object 2. The motor 803 may cause the screw rod 802 to rotate in response to a rotation signal from the controller 804 such that the moving board 801 is retracted into the absorption pad 13. Accordingly, the object 2 may be picked up.

The object that is picked up may be moved to a desired location and forcibly released. When the vacuum in the pad holder 16 is decreased, the suction force may be reduced so as to be less than the force that may be exerted on the moving board 801 by the motor 803 via the screw rod 802. Consequently, the motor 803 may cause the screw rod 802 to rotate in response to a counter-rotation signal from the controller 804 such that the moving board 801 is protracted so as to protrude out of the absorption inlet 13a of the absorption pad 13 to forcibly release the object 2. Alternatively, the vacuum may be maintained and the force exerted by the motor 803 may be increased to forcibly release the object 2.

Figure 14:
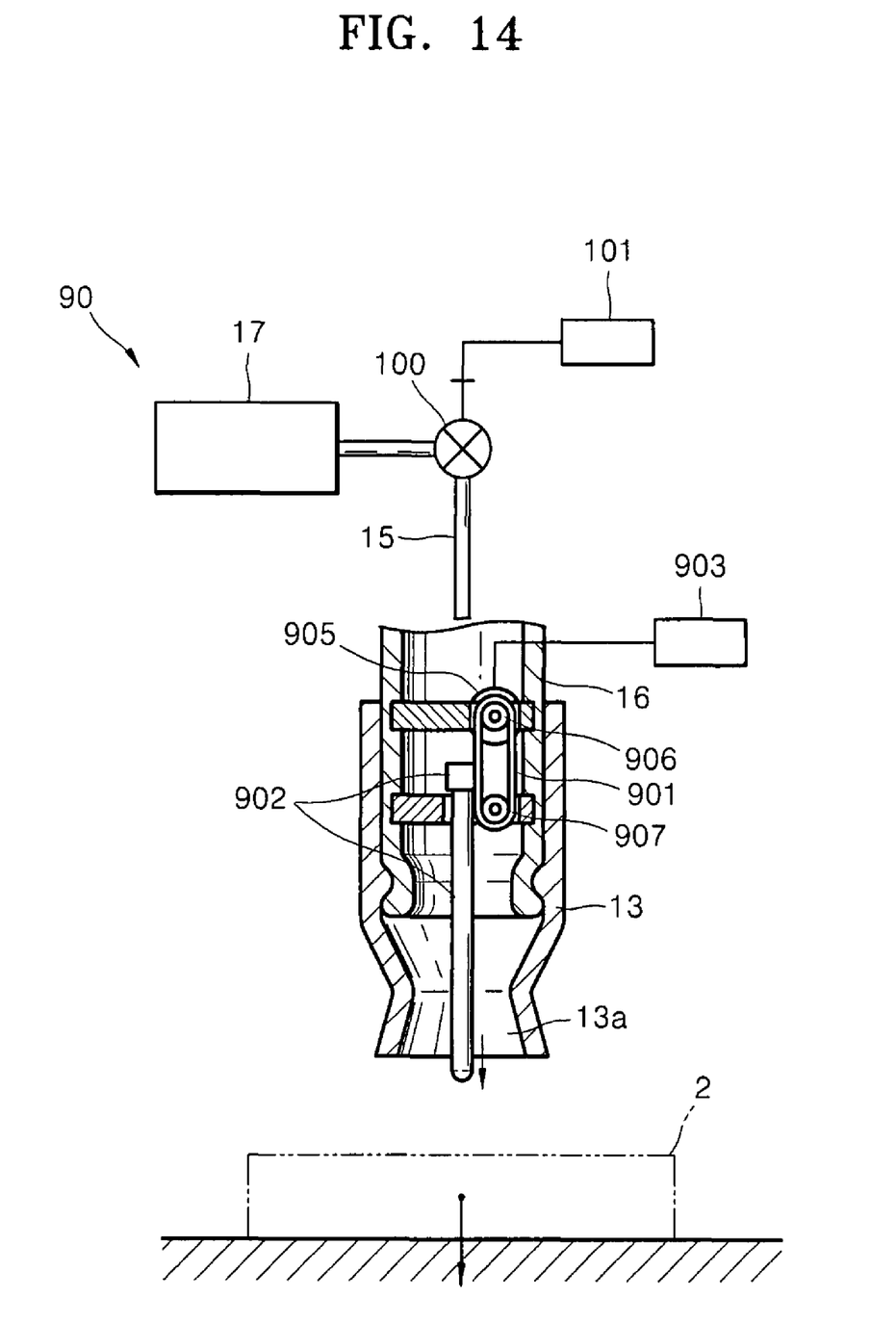
FIG. 14 is a cross-sectional view of another separator according to example embodiments.

Referring to FIG. 14, a vacuum type pickup apparatus 90 according to example embodiments may have a separator including a belt structure, a moving board 902, and a controller 903. The belt structure may be provided in the pad holder 16 and may include a driving pulley 906 rotated by a motor 905, a driven pulley 907, and a belt 901. The moving board 902 may be connected to the belt 901 such that a front end of the moving board 902 may contact the object 2. The moving board 902 may be protracted so as to protrude out of the absorption inlet 13a of the absorption pad 13 and retracted so as to be received in the absorption pad 13. The controller 903 may supply a rotation signal and a counter-rotation signal to the motor 905.

When a vacuum is generated in the pad holder 16, a suction force may be exerted on the object 2. The motor 905 may cause the belt 901 to rotate in response to a rotation signal from the controller 903 such that the moving board 902 may be retracted into the absorption pad 13. Accordingly, the object 2 may be picked up.

The object 2 that is picked up may be moved to a desired location and forcibly released. When the vacuum in the pad holder 16 is decreased, the suction force exerted on the object 2 may be reduced so as to be less than the force that may be exerted on the moving board 902 by the belt structure. Consequently, the motor 905 may cause the belt 901 to rotate in response to a counter-rotation signal from the controller 903 such that the moving board 902 is protracted so as to protrude out of the absorption inlet 13a of the absorption pad 13 to forcibly release the object 2. Alternatively, the vacuum may be maintained and the force exerted by the belt structure may be increased to forcibly release the object 2.

The vacuum type pickup apparatus shown in FIGS. 11 through 14 may include a vacuum blocking valve 100 provided on the vacuum line 15. The vacuum line 15 may connect the vacuum generator 17 and the pad holder 16, and a vacuum blocking controller 101 may supply a blocking control signal to the vacuum blocking valve 100 so as to selectively block the vacuum line 15. The vacuum generated by the vacuum generator 17 in the pad holder 16 via the vacuum line 15 may be adjusted with the vacuum blocking valve 100 without changing the operating state of the vacuum generator 17. For example, when the object 2 is to be forcibly released, the vacuum blocking valve 100 can be blocked/closed (partially or completely) so as to decrease the vacuum in the pad holder 16.

A vacuum type pickup method according to example embodiments may include generating a vacuum in a pad holder 16, wherein the pad holder 16 is connected to an absorption pad 13. An absorption inlet 13a of the absorption pad 13 may contact and/or pick up an object 2 by virtue of the suction force from the vacuum. The object 2 may be moved to a desired location and forcibly released via a separator provided in the pad holder 16. The separator may include a push bar 11 that may be protracted so as to protrude out of the absorption inlet 13a of the absorption pad 13 during the forcible release of the object 2. On the other hand, the push bar 11 may also be retracted so as to be received into the absorption pad 13 during the pickup of the object 2. The separator may also include magnetic bodies (e.g., permanent magnets and/or electromagnets) provided in the pad holder 16 that generate a magnetic force (e.g., attractive and/or repulsive forces) between the magnetic bodies so as to facilitate the movement of the push bar 11.

When the object 2 is being forcibly released, the air around the absorption pad 13 may be drawn into the pad holder 16, thus reducing or preventing the possible contamination by impurities to the object 2 as well as the equipment around the object 2. Also, an additional vacuum extinguisher may not be required, thus simplifying the structure of the vacuum type pickup apparatus and reducing installation costs. Furthermore, the object 2 may be picked up and released in a relatively expedient, safe, and accurate manner, despite the suction force of the vacuum that may be maintained in the pad holder 16.

While example embodiments have been disclosed herein, it should be understood that other variations may be possible. Such variations are not to be regarded as a departure from the spirit and scope of example embodiments of the present disclosure, and all such modifications as would be obvious to one skilled in the art are intended to be included within the scope of the following claims.

What is claimed is:

1. A vacuum type pickup apparatus, comprising:
   an absorption pad having an absorption inlet for picking up an object;
   a pad holder having a vacuum line, the pad holder connected to the absorption pad; and
   a separator in the pad holder for forcibly releasing the object from the absorption inlet by magnetic repulsion.

2. The vacuum type pickup apparatus of claim 1, wherein the separator comprises:
   a push bar in the pad holder; and
   a push bar compression device in the pad holder and connected to the push bar so as to protract or retract the push bar,
   wherein the push bar protrudes out of the absorption inlet of the absorption pad to release the object.

3. The vacuum type pickup apparatus of claim 2, wherein the push bar compression device comprises:
   a first magnetic body in the pad holder; and
   a second magnetic body in an inner guide surface of the pad holder, the adjacent surfaces of the first and second magnetic bodies having the same polarity so as to have a repulsive force between the first and second magnetic bodies.

4. The vacuum type pickup apparatus of claim 3, wherein the first and second magnetic bodies are disc-shaped and have one or more holes in each of the first and second magnetic bodies.

5. The vacuum type pickup apparatus of claim 3, wherein at least one of the first and second magnetic bodies are permanent magnets.

6. The vacuum type pickup apparatus of claim 3, wherein the first magnetic body is a permanent magnet and the second magnetic body is an electromagnet.

7. The vacuum type pickup apparatus of claim 6, wherein the electromagnet includes a coil and a controller, the controller supplying an attractive force control signal to the coil to generate an attractive force between the permanent magnet and the electromagnet when the object is picked up, and supplying a repulsive force control signal to the coil to generate a repulsive force between the permanent magnet and the electromagnet when the object is released.

8. A vacuum type pickup method, comprising:
   generating a vacuum in a pad holder, the pad holder connected to an absorption pad;
   contacting an absorption inlet of the absorption pad to an object so as to pick up the object; and
   forcibly releasing the object from the absorption inlet of the absorption pad by magnetic repulsion using a separator provided in the pad holder.

9. The method of claim 8, wherein the object is forcibly released using a push bar which protrudes out of the absorption inlet of the absorption pad.

10. The method of claim 9, wherein the push bar is protracted using the magnetic force of magnetic bodies in the pad holder.

* * * * *